(12) United States Patent
Wang et al.

(10) Patent No.: US 7,760,506 B1
(45) Date of Patent: Jul. 20, 2010

(54) ELECTRONIC COMPONENTS, SYSTEMS AND APPARATUS WITH AIR FLOW DEVICES

(75) Inventors: Shih-Yuan Wang, Palo Alto, CA (US); Philip J. Kuekes, Menlo Park, CA (US); Chandrakant Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 274 days.

(21) Appl. No.: 11/758,718

(22) Filed: Jun. 6, 2007

(51) Int. Cl.
*H05K 7/20* (2006.01)
*G06F 1/20* (2006.01)

(52) U.S. Cl. ......... 361/709; 361/679.48; 361/679.54; 361/695; 361/704; 361/719

(58) Field of Classification Search ......... 361/679.46, 361/679.48–679.49, 679.51, 690, 694–695, 361/704, 709, 719–720, 710; 165/80.3; 174/16.1; 454/184; 257/706–707, 721–722
See application file for complete search history.

(56) References Cited

U.S. PATENT DOCUMENTS

| 5,218,514 | A | * | 6/1993 | Huynh et al. | 361/679.47 |
|---|---|---|---|---|---|
| 5,375,655 | A | * | 12/1994 | Lee | 165/185 |
| 5,597,035 | A | * | 1/1997 | Smith et al. | 165/80.3 |
| 5,661,638 | A | | 8/1997 | Mira | |
| 5,794,684 | A | * | 8/1998 | Jacoby | 165/80.3 |
| 5,915,463 | A | * | 6/1999 | Romero et al. | 165/80.3 |
| 6,015,008 | A | * | 1/2000 | Kogure et al. | 165/185 |
| 6,047,765 | A | * | 4/2000 | Zhan | 165/80.3 |
| 6,134,108 | A | | 10/2000 | Patel et al. | |
| 6,269,864 | B1 | * | 8/2001 | Kabadi | 165/80.3 |
| 6,343,016 | B1 | * | 1/2002 | Lin | 361/704 |
| 6,452,789 | B1 | | 9/2002 | Pallotti et al. | |
| 6,545,869 | B2 | * | 4/2003 | Bonitz et al. | 361/704 |
| 6,574,104 | B2 | | 6/2003 | Patel et al. | |
| 6,603,658 | B2 | | 8/2003 | Manno et al. | |
| 6,665,164 | B2 | * | 12/2003 | Chu et al. | 361/106 |
| 6,698,511 | B2 | * | 3/2004 | DiBene et al. | 165/185 |
| 6,747,873 | B1 | * | 6/2004 | Searls et al. | 361/695 |
| 6,829,149 | B1 | * | 12/2004 | Chang et al. | 361/771 |
| 6,904,968 | B2 | | 6/2005 | Beitelmal et al. | |
| 6,906,921 | B2 | * | 6/2005 | Searls et al. | 361/695 |
| 6,920,049 | B2 | | 7/2005 | Brooks et al. | |
| 7,086,459 | B2 | | 8/2006 | Beitelmal et al. | |
| 7,096,678 | B2 | * | 8/2006 | Petroski | 62/3.2 |
| 7,151,668 | B1 | * | 12/2006 | Stathakis | 361/700 |
| 7,198,094 | B2 | | 4/2007 | Barsun et al. | |
| 7,307,841 | B2 | * | 12/2007 | Berlin et al. | 361/699 |

(Continued)

FOREIGN PATENT DOCUMENTS

DE  10153512 A1 *  5/2003

(Continued)

OTHER PUBLICATIONS

A. H. Beitelmal, "Effects of Surface Roughness on the Average Heat Transfer of an Impinging Air Jet," Int. Comm. Heat Mass Transfer, vol. 27, No. 1, pp. 1-12 (2000).

*Primary Examiner*—Jayprakash N Gandhi
*Assistant Examiner*—Robert J Hoffberg (57) ABSTRACT

Electronic components, systems and apparatus including one or more air flow devices, such as an aerodynamic element and/or an air diverter.

22 Claims, 10 Drawing Sheets

U.S. PATENT DOCUMENTS

| | | | | |
|---|---|---|---|---|
| 7,310,228 B2 * | 12/2007 | Chen | ............................ | 361/695 |
| 7,333,337 B2 * | 2/2008 | Kita | ............................ | 361/710 |
| 7,355,856 B2 * | 4/2008 | Petroski | ...................... | 361/710 |
| 7,447,021 B2 * | 11/2008 | Chen | ........................ | 361/695 |
| 7,474,528 B1 * | 1/2009 | Olesiewicz et al. | ......... | 361/695 |
| 2004/0250986 A1 * | 12/2004 | Tsang et al. | ................. | 165/59 |
| 2006/0042291 A1 * | 3/2006 | Petroski | ...................... | 62/264 |
| 2006/0096737 A1 * | 5/2006 | Kimura | .................... | 165/80.3 |
| 2006/0274498 A1 * | 12/2006 | Chen | ........................ | 361/687 |
| 2007/0042514 A1 | 2/2007 | Wu et al. | | |
| 2007/0240868 A1 * | 10/2007 | Wu et al. | .................... | 165/185 |
| 2007/0284080 A1 * | 12/2007 | Sun | ............................ | 165/80.3 |
| 2008/0041562 A1 * | 2/2008 | Bhatia | ....................... | 165/80.3 |
| 2008/0066888 A1 * | 3/2008 | Tong et al. | ................. | 165/80.3 |

FOREIGN PATENT DOCUMENTS

| | | | |
|---|---|---|---|
| JP | 02276264 A | * | 11/1990 |
| JP | 07183678 A | * | 7/1995 |

\* cited by examiner

ELECTRONIC COMPONENTS, SYSTEMS AND APPARATUS WITH AIR FLOW DEVICES

BACKGROUND OF THE INVENTIONS

Electronic systems and apparatus commonly include various electronic components that are mounted on one or more circuit boards. Many of these electronic components (e.g. processors, controllers, video cards, disk drives, etc.) generate heat. Given that the performance and/or reliability of the electronic components can deteriorate as their temperatures increase, some electronic components include apparatus (e.g. finned heat sinks) that remove heat from the component. To further cool the electronic components, many electronic systems also include cooling apparatus that forces air through the housing where the components reside to remove heat. Such cooling apparatus typically consists of one or more fans or other blowers that direct a flow of air over the circuit board and electronic components to cool the components by convection.

Although the present inventions are not limited thereto, blade servers are one example of electronic apparatus in which it can be difficult to sufficiently cool electronic components. Blade servers are comprehensive computing systems that include processors, memory, network connections, and associated electronics all on a single or multiple circuit boards. For example, one or more server blades may be contained in a enclosure, along with server appliance blades, network-switch blades, storage blades, management blades, local-area-network (LAN) blades, and other blades. The rearward end of the blades frequently include connectors that mate with corresponding connectors on the chassis within the enclosure when the blades are inserted into the enclosure. With respect to cooling, many blade server enclosures include fans or other blowers which create airflow through the individual blade housings. The air flows, from the forward end of the blades to rearward end and over the electronic components, in a direction that is generally parallel to the circuit boards within the blade housings.

The present inventors have determined that conventional cooling apparatus are susceptible to improvement. For example, high heat density from the electronic components require high mass flow and high cooling fluid velocity in order to minimize the film resistance and caloric resistance and, accordingly, reduce the overall resistance to heat transfer from the electronic components to the cooling fluid. The present inventors have determined that conventional cooling apparatus can lead to excessive air turbulence when high mass flow and high cooling fluid velocity are required. Excessive air turbulence can, in turn, result in circuit board vibrations which can cause electronic component and connector failures, poor cooling efficiency and increased power consumption, and index changes that adversely effect free space optics. Turbulence issues notwithstanding, the present inventors have also determined that the manner in which air is directed through conventional electronic apparatus is susceptible to improvement.

BRIEF DESCRIPTION OF THE DRAWINGS

Detailed description of embodiments will be made with reference to the accompanying drawings.

DETAILED DESCRIPTION OF THE EMBODIMENTS

The following is a detailed description of the best presently known modes of carrying out the inventions. This description is not to be taken in a limiting sense, but is made merely for the purpose of illustrating the general principles of the inventions. It is noted that detailed discussions of aspects of electronic components, systems and apparatus that are not required for the understanding of the present inventions have been omitted for the sake of simplicity. The present inventions are also applicable to a wide range of electronic components, systems and apparatus, including those presently being developed or yet to be developed. Such systems include, but are not limited to the exemplary electronic components, circuit boards, and servers discussed below.

As illustrated for example in FIGS. 1-4, an electronic system 100 in accordance with one embodiment of a present invention includes an electronic component 102 that is mounted on a circuit board 104. The exemplary electronic component 102 is a processor including a package 106, in which the processing circuitry (not shown) is located, and a heat sink 108 with a base 110 and fins 112. Air passages 114 are located between the fins 112. The exemplary electronic system 100 is also provided with aerodynamic devices 116 and 118 at the forward and rearward ends of the electronic component 102. As used herein, "forward end" and "rearward end" are defined in the context of the air flow AF direction (FIG. 1), i.e. air passes over the forward end first and the rearward end last. The aerodynamic devices 116 and 118 eliminate respective abrupt discontinuities in the air flow direction and, accordingly, perform the functions of increasing the laminar air flow and/or reducing air turbulence, as compared to the laminar air flow and/or turbulence which would be associated with an otherwise identical electronic system without the aerodynamic devices 116 and 118. The laminar air flow and turbulence issues are discussed in greater detail below with reference to FIGS. 8 and 9.

Figure 1:
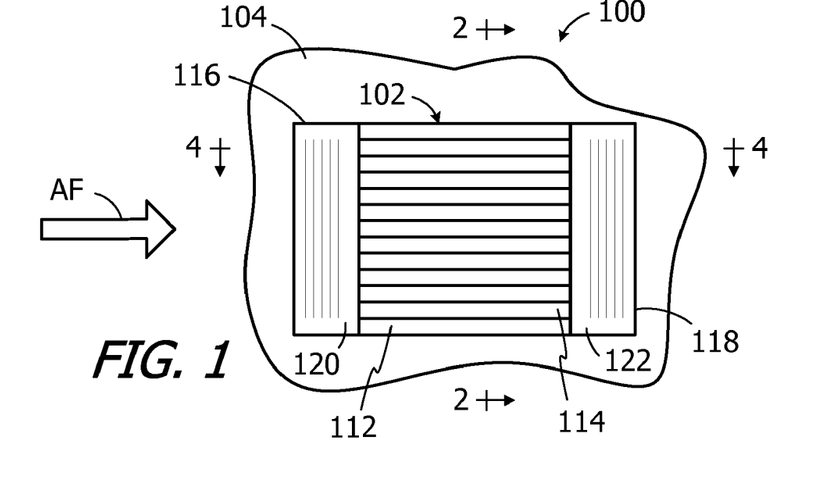
FIG. 1 is a plan view of a portion of an electronic system in accordance with one embodiment of a present invention.
Figure 2:
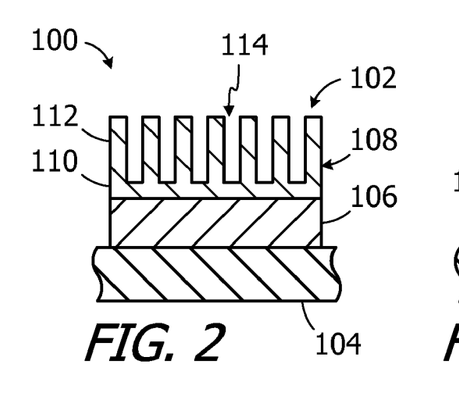
FIG. 2 is a section view taken along line 2-2 in FIG. 1.
Figure 3:
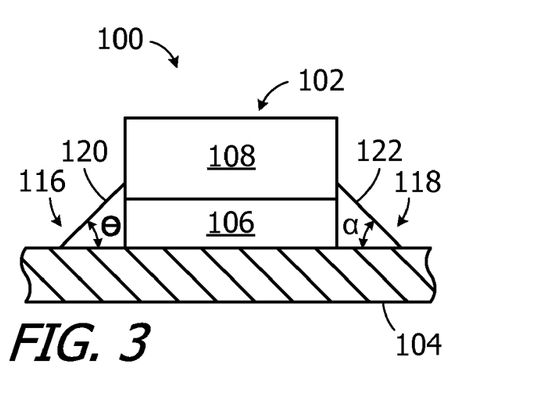
FIG. 3 is a side view of the portion of the electronic system illustrated in FIG. 1.
Figure 4:
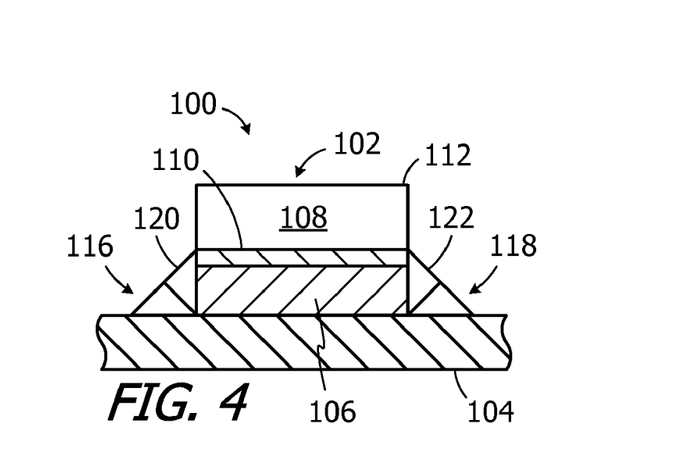
FIG. 4 is a section view taken along line 4-4 in FIG. 1.
Figure 5:
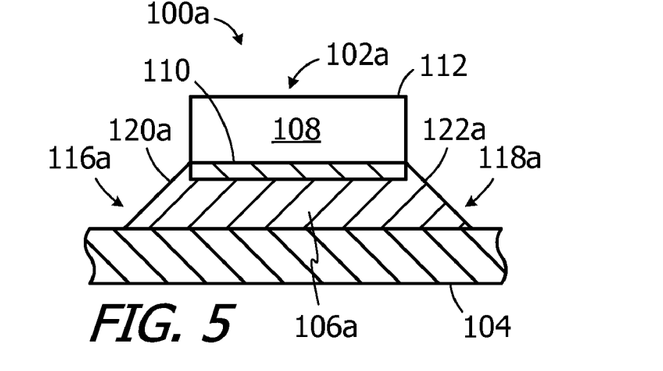
FIG. 5 is a section view of a portion of an electronic system in accordance with one embodiment of a present invention.
Figure 6:
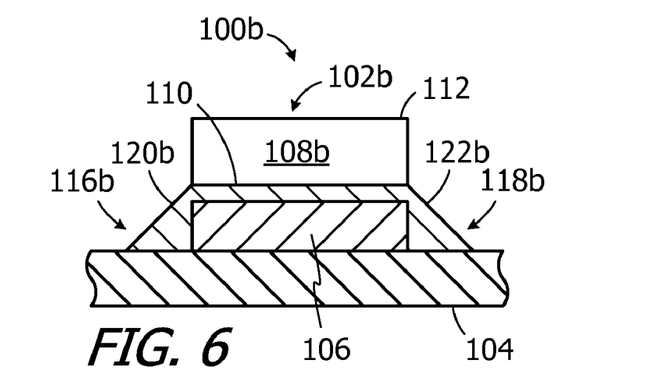
FIG. 6 is a section view of a portion of an electronic system in accordance with one embodiment of a present invention.
Figure 7:
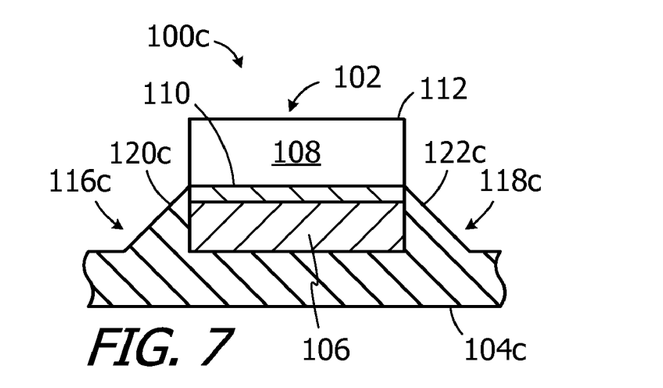
FIG. 7 is a section view of a portion of an electronic system in accordance with one embodiment of a present invention.

Referring more specifically to FIGS. 3 and 4, the aerodynamic devices 116 and 118 in exemplary electronic system 100 are separately manufactured structural elements that are secured to the electronic component 102 and/or the circuit board 104 during assembly. Aerodynamic devices may, however, be part of other aspects of an electronic system. For example, the exemplary electronic systems 100a-c respectively illustrated in FIGS. 5-7 are substantially similar to the electronic system illustrated in FIGS. 1-4 and similar elements are represented by similar reference numerals. In the exemplary electronic system 100a, the aerodynamic devices 116a and 118a are incorporated into the electronic component 102a and, more specifically, are incorporated into the processor package 106a. The aerodynamic devices 116b and 118b in the exemplary electronic system 100b illustrated in FIG. 6 are incorporated into a different portion of the electronic component 102b. Here, the aerodynamic devices 116b and 118b are incorporated into the heat sink 108b. Aerodynamic devices may also be incorporated into a circuit board. For example, as illustrated example in FIG. 7, the aerodynamic devices 116c and 118c in the electronic device 100c are incorporated into the circuit board 104c.

The exemplary aerodynamic devices 116-116c and 118-118c illustrated in FIGS. 1-7 extend the width of the associated electronic component 102-102b, i.e. the dimension of the electronic component perpendicular to the air flow AF direction, and extend from the top surface (in the illustrated orientation) of circuit board 104 (or 104c) to the top surface of the heat sink base 110. The exemplary aerodynamic devices 116-116c and 118-118c also have planar top surfaces 120-120c and 122-122c with a slope of about 1.0. The configuration of the top surfaces 120-120c and 122-122c may, however, be varied to suit the requirements of particular applications. In particular, the configuration of the top surfaces 120-120c and 122-122c may be used to minimize drag, maximize air flow velocity, and/or create other conditions that result in more efficient heat transfer. For example, instead of being planar, the top surfaces 120-120c and 122-122c may have a convex curve shape, a concave curve shape, or any other appropriately curved shape. The top surfaces 120-120c and 122-122c may also have slopes that are greater than 1.0 or are less than 1.0. The angles $\theta$ and $\alpha$ (FIG. 3) defined by the surface of the circuit board and the top surfaces 120-120c and 122-122c will, however, be acute. Additionally, although the top surfaces 120-120c and 122-122c are essentially identical in the exemplary electronic systems 100-100c illustrated in FIGS. 1-7, the top surfaces 120-120c and 122-122c may have different configurations for particular aerodynamic purposes in other implementations. For example, the slopes of the top surfaces 120-120c may be different than the slopes of the top surfaces 122-122c. Moreover, although the top surfaces 120-120c and 122-122c are continuous and uniform across the width of the associated electronic component in the illustrated embodiments, they may alternatively be discontinuous and/or non-uniform in other embodiments.

Figure 7A:
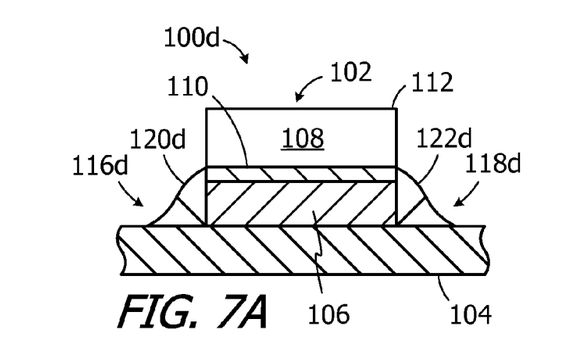
FIG. 7A is a section view of a portion of an electronic system in accordance with one embodiment of a present invention.

One specific example of the use of aerodynamic devices with curved shapes is illustrated in FIG. 7A. Here, the top surfaces 120d and 122d of aerodynamic devices 116d and 118d in the electronic system 100d each have an s-like shape with an inflection point that separates the concave portion of the surface from the convex portion. The aerodynamic devices 116d and 118d are separately manufactured structural elements and are secured to the electronic component 102 and/or the circuit board 104 during assembly. Nevertheless, aerodynamic devices with the same or similar top surface shapes may form part of the processor package (note FIG. 5), part of the heat sink (note FIG. 6) or part of the circuit board (note FIG. 7).

Figure 7B:
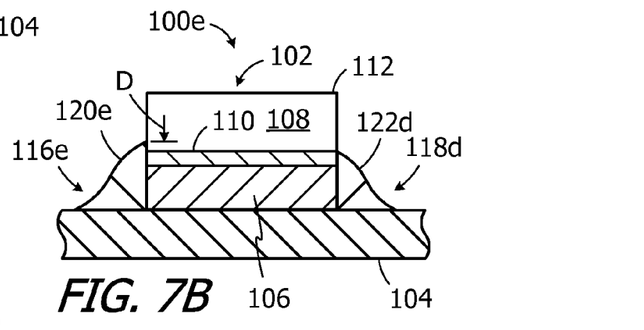
FIG. 7B is a section view of a portion of an electronic system in accordance with one embodiment of a present invention.

It should also be noted that the downstream end of the aerodynamic devices 116-116d may be slightly offset from the upstream end of the associated electronic component. For example, the aerodynamic device 116e and electronic component 102 in the electronic system 100e illustrated in FIG. 7B are respectively sized such that the downstream end of the aerodynamic device is spaced apart from the top surface of heat sink base 110 by a distance D. So configured, there will be a slight expansion of the air flow as it passes the downstream end of the aerodynamic device 116e. The associated adiabatic cooling of the air will result in more efficient heat transfer from the heat sink 108 to the air flow. Similar offsets may also be associated with any of the other aerodynamic devices disclosed herein.

Figure 7C:
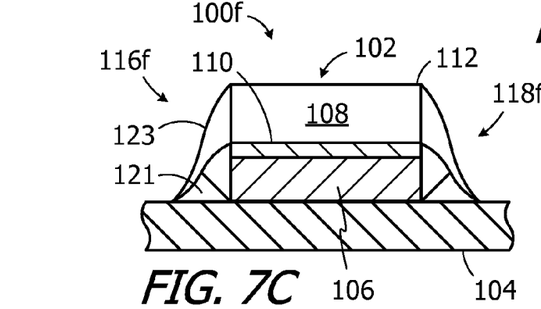
FIG. 7C is a section view of a portion of an electronic system in accordance with one embodiment of a present invention.
Figure 7D:
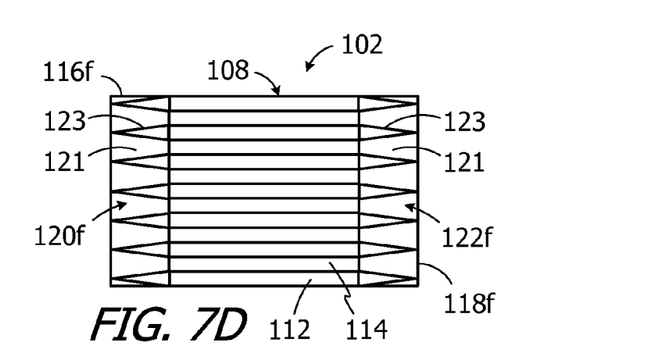
FIG. 7D is a top view of the electronic component illustrated in FIG. 7C.

The top surfaces of the aerodynamic devices may also be configured to direct the air flow in to, and out of, the air passages 114 that are located between the fins 112. As illustrated for example in FIGS. 7C and 7D, the exemplary aerodynamic devices 116f and 118f in the electronic system 100f each include a base portion 121 and tapered projections 123. The tapered projections 123 are aligned with the heat sink fins 112. The base portion 121 and tapered projections 123 together define grooved surfaces 120f and 122f which direct the air flow around the upstream ends of the fins 112 and provide a turbulence reducing transition at the downstream end of the air passages 114. In the illustrated embodiment, the upstream and downstream ends of the projections taper to a pointed end. Alternatively, tapered projections with curved upstream and downstream ends, tapered projections with combinations of curved and pointed ends, and tapered projections with curves/points at only one of the ends may be employed.

Figure 8:
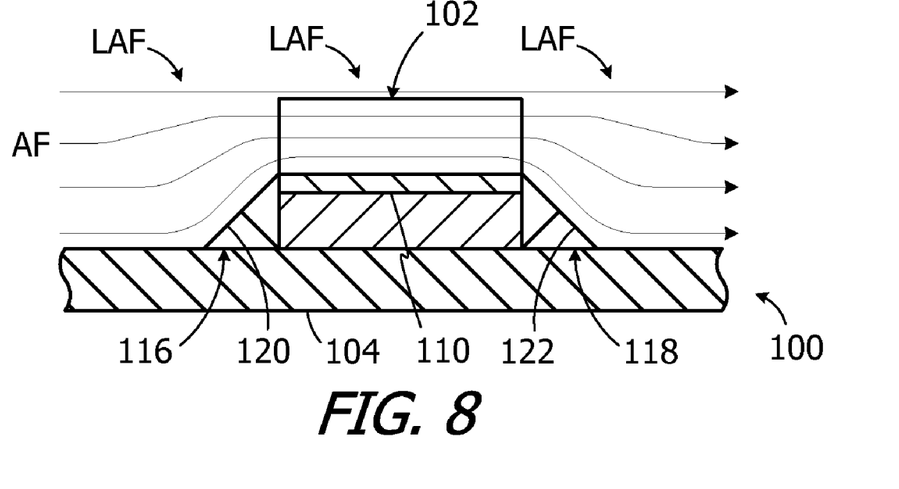
FIG. 8 is a section view showing air flowing over a portion of the electronic system illustrated in FIGS. 1-4.

The manner in which air flows over the exemplary electronic system 100 is illustrated in FIG. 8. The air flow AF is laminar as it approaches the electronic component 102 in a direction that is parallel to the circuit board 104. The portion of the air flow AF that is adjacent to the circuit board 104 is gradually redirected up to the top surface of the heat sink base 110 by the aerodynamic element 116 as it approaches the electronic component 102. As a result, there is laminar air flow LAF over the electronic component 102. A portion of the air flow AF is also gradually allowed to return to the region adjacent to the circuit board 104 once it is downstream from the electronic component 102 and, as a result, there is also laminar air flow LAF downstream from the electronic component.

Figure 9:
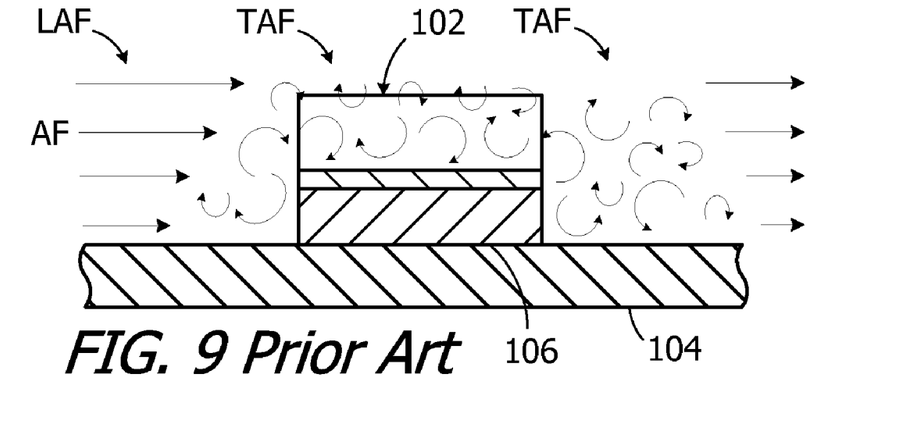
FIG. 9 is a section view showing air flowing over a portion of a conventional electronic system.

For purposes of comparison, the manner in which air flows over an otherwise identical electronic system which lacks aerodynamic elements is illustrated in FIG. 9. The air flow AF is also laminar as it approaches the electronic component 102 in a direction that is parallel to the circuit board 104. Here, however, the portion of the air flow AF that is adjacent to the circuit board 104 is deflected by a vertical structure (i.e. the forward ends of the processor package 106 and the heat sink base 110). The abrupt redirection of the air flow AF results in turbulent air flow TAF (e.g. the illustrated vortex shedding caused by air flow across a blunt structure) upstream of, and over, the electronic component 102. A portion of the turbulent air flow TAF will abruptly return to the region adjacent to the circuit board 104 downstream from the electronic component 102, which produces additional turbulent air flow TAF downstream from the electronic component. The turbulent air flow TAF is, as noted above, problematic for a number of reasons. For example, the turbulent air flow TAF may result in circuit board vibrations which can cause electronic component and connector failures, poor cooling efficiency and increased power consumption, and index changes that adversely effect free space optics.

Figure 10:
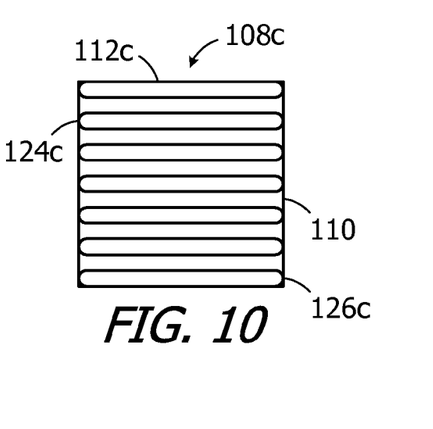
FIG. 10 is a top view of a heat sink in accordance with one embodiment of a present invention.
Figure 11:
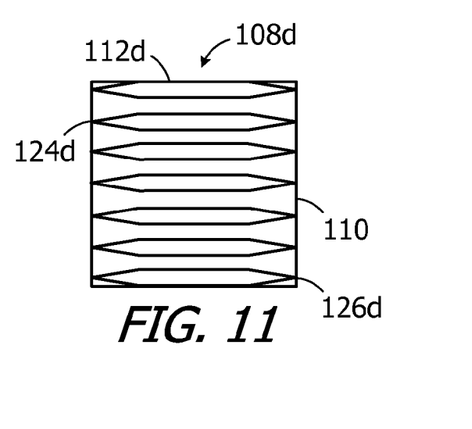
FIG. 11 is a top view of a heat sink in accordance with one embodiment of a present invention.

In addition to aerodynamic elements, various aspects of an electronic system may be used to facilitate laminar flow. Heat sink fins, for example, may be used to facilitate laminar flow. To that end, the exemplary heat sink 108c illustrated in FIG. 10 includes a base 110 and a plurality of fins 112c, with curved forward ends 124c and curved rearward ends 126c, carried by the base. Similarly, and as illustrated in FIG. 11, the exemplary heat sink 108d includes a base 110 and a plurality of fins 112d with pointed forward ends 124d and pointed rearward ends 126d. The curves/points form aerodynamic surfaces which eliminate the flat forward and rearward surfaces that are perpendicular to the air flow direction in some heat sink fins, e.g. those illustrated in FIG. 1. It should also be noted that, as applications so require, the curved/pointed ends may be only at the forward end of a fin or only at the rearward end of a fin. The curved/pointed ends may also be combined in the same fin, i.e. a fin may have a curved forward end and a pointed rearward end or a pointed forward end and a curved rearward end.

Figure 11A:
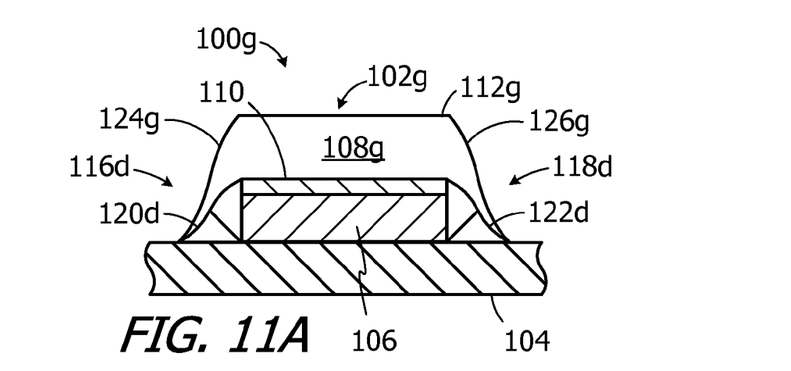
FIG. 11A is a section view of a portion of an electronic system in accordance with one embodiment of a present invention.
Figure 11B:
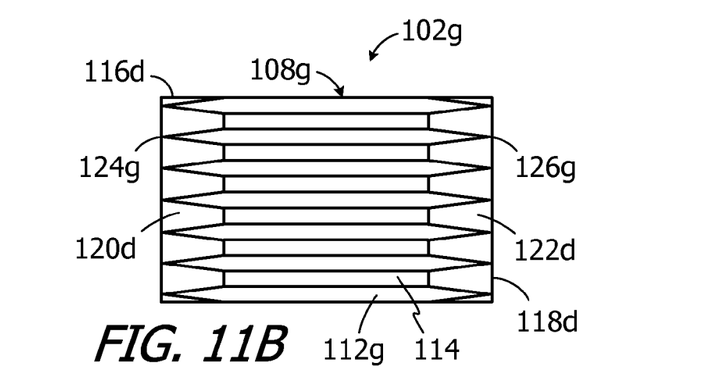
FIG. 11B is a top view of the electronic component illustrated in FIG. 11A.

Heat sink fins may also be used in a manner similar to the aerodynamic device tapered projections (FIGS. 7C and 7D) to direct the air in to, and out of, the air passages 114. More specifically, and referring to FIGS. 11A and 11B, the exemplary electronic system 100g includes an electronic component 102g with a heat sink 108g that has fins 112g which extend over the aerodynamic devices 116d and 118d. The exemplary fins 112g, which extend down the surfaces 120d and 122d to the upstream end of the aerodynamic device 116d and the downstream end of the aerodynamic device 118d, include pointed forward and rearward ends 124g and 126g. Alternatively, fins with curved forward and rearward ends, fins with combinations of curved and pointed ends, and fins with curves/points at only one of the ends may be employed in arrangements similar to that illustrated in FIGS. 11A and 11B.

As noted above, laminar air flow is desirable because reducing turbulence reduces vibrations, improves cooling efficiency and power consumption efficiency, and reduces index changes which adversely effect free space optics. Nevertheless, in some instances, it may also be desirable to have a thin layer of turbulent air flow (e.g. about 0.5% to about 5.0%, or more, of the total thickness of the otherwise laminar flow) adjacent to some or all of the surfaces of an electronic system. The thin layer of turbulent air flow increases heat transfer and reduces drag by breaking up the boundary layer, thereby increasing the efficiency of the cooling process. However, because the layer of turbulent air flow is thin and a very small portion of the overall air flow, which is otherwise laminar, the thin turbulent layer will not create the turbulence-related problems described above. It should be noted that any free space optics will be located within the laminar region of air flow.

Figure 12:
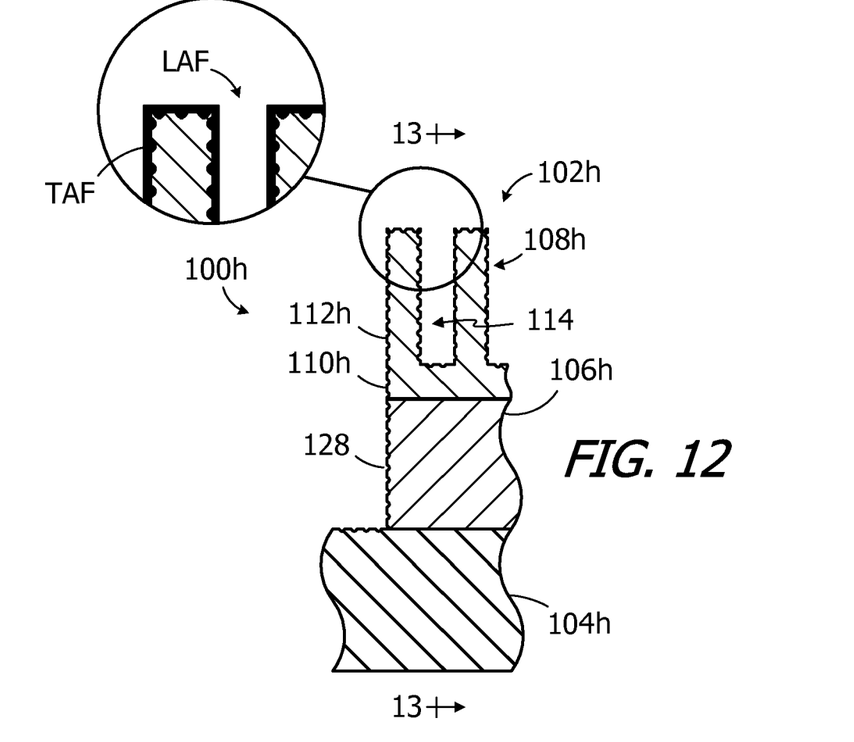
FIG. 12 is a section view of a portion of an electronic system in accordance with one embodiment of a present invention.
Figure 13:
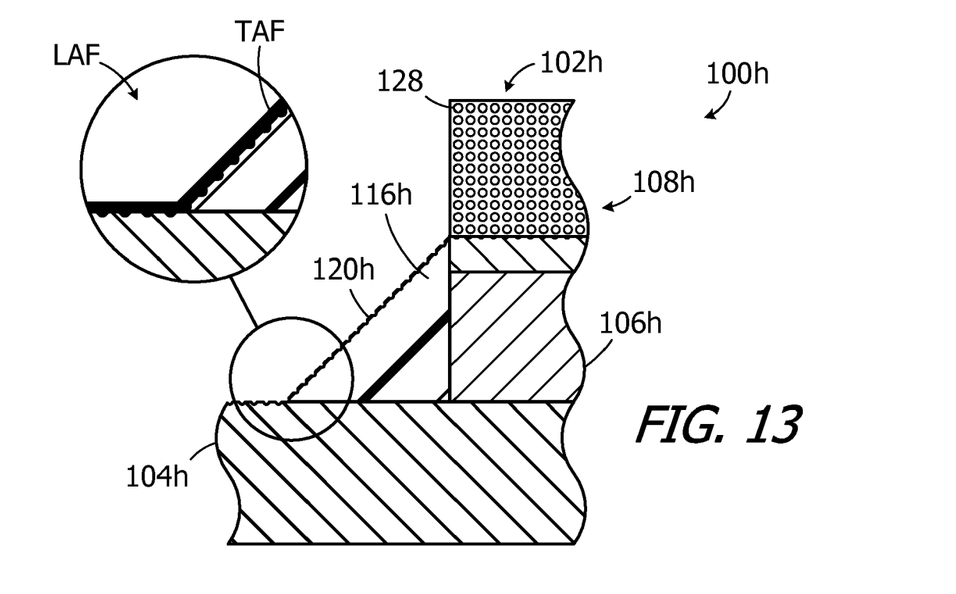
FIG. 13 is a section view taken along line 13-13 in FIG. 12.

One example of an electronic system that is configured to create a thin layer of turbulent air flow within an otherwise laminar flow is generally represented by reference numeral 100h in FIGS. 12 and 13. Electronic system 100h is substantially similar to electronic system 100. Electronic system 100h includes an electronic component 102h on a circuit board 104h. The exemplary electronic component 102h has a processor within a package 106h and a heat sink 108h with a base 110h and fins 112h that define air passages 114 therebetween. Here, however, the electronic system 100h is provided with structure that performs the function of forming a thin layer of turbulent air flow TAF between a laminar air flow and some or all of the elements of the electronic system. The structure that creates the thin layer of turbulent air TAF is a plurality of surface discontinuities 128 that are formed on some or all of the surfaces of the electronic system 100h which are exposed to air flow. In the illustrated embodiment, the surface discontinuities 128 are formed on the surfaces of the electronic component 102h (i.e. the package 106h and the heat sink 108h), the circuit board 104h, the top surface 120h and side surfaces of the forward aerodynamic device 116h, and the top and side surfaces of the rearward aerodynamic device (not shown).

The surface discontinuities 128 may be indentations (as shown) or protrusions, and the shape, size, and spacing (or "pitch") of the surface discontinuities may be varied as required by the particular electronic system. The shape, size, pitch and/or type (e.g. indentation or protrusion) may also be varied within a single electronic system depending on, for example, the desires to reduce drag, improve cooling efficiency and reduce vibrations. The surface discontinuities 128 may also be organized in a matrix pattern or randomly distributed. A discussion concerning the use of surface discontinuities to effect heat transfer is presented in A. H. Beitelmal, "Effects of Surface Roughness on the Average Heat Transfer of an Impinging Air Jet," Int. Comm. Heat Mass Transfer, Vol. 27, No. 1, pp. 1-12 (2000).

In the illustrated embodiment, the surface discontinuities 128 are circular in shape (i.e. dimple-like indentations), have a diameter of about 250 µm to about 1000 µm, with a pitch of about 1000 µm to about 2500 µm, and are about 50 µm to about 250 µm deep. This arrangement produces a layer of turbulent air flow that is about 100 µm to about 2000 µm thick. An arrangement of conical protrusions that have a diameter of about 250 µm to about 1000 µm, a pitch of about 1000 µm to about 2500 µm apart, and height of about 50 µm to about 250 µm would also produce a layer of turbulent air flow that is about 100 µm to about 2000 µm thick.

Figure 14:
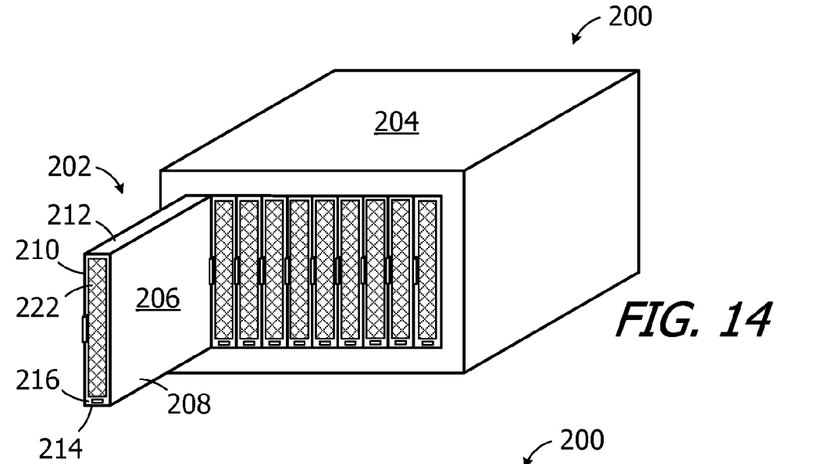
FIG. 14 is front perspective view of a blade server in accordance with one embodiment of a present invention.
Figure 15:
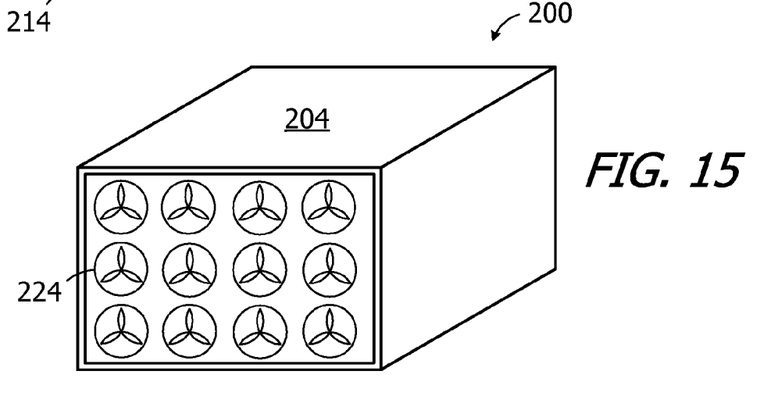
FIG. 15 is rear perspective view of the blade server illustrated in FIG. 14.
Figure 16:
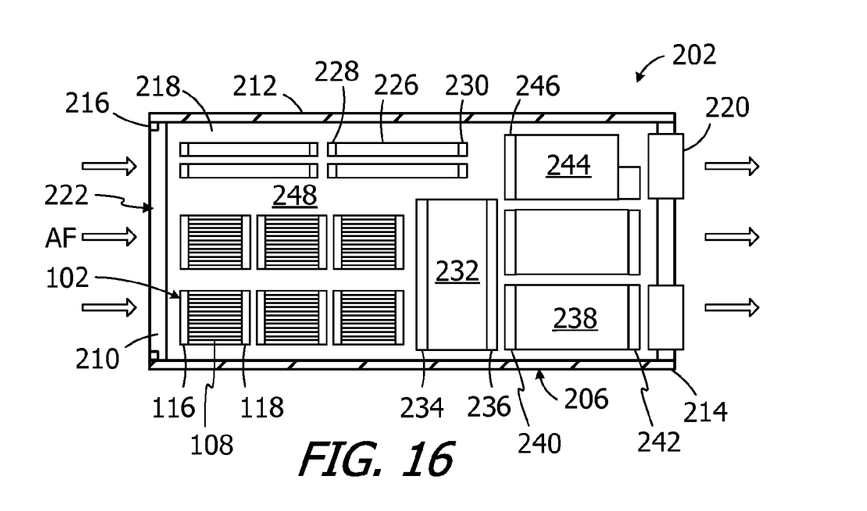
FIG. 16 is a section view showing the interior of a blade in accordance with one embodiment of a present invention.

One example of an apparatus that may incorporate the present electronic systems is the blade server 200 illustrated in FIGS. 14-16. The exemplary blade server 200 includes a plurality of blades 202 that may be removably mounted within an enclosure 204. Each blade 202 includes a housing 206, which consists essentially of side walls 208 and 210, a top wall 212, a bottom wall 214, and a front wall 216. Each blade 202 also includes a circuit board 218, various electronic components (discussed below) on the circuit board, and electrical connectors 220 that connect the blade to the remainder of the server 200. With respect to the cooling of the blades 202, the front walls 216 include inlets 222 and the rear of the enclosure includes a plurality of fans 224. The fans 224 draw air into the blades 202 by way of the inlets 222 and pull the air through the interior of the housings 206 in a direction that is parallel to the surface of the circuit board 218. Other devices that may be used to force air though the blades 202 include, but are not limited to, a central high pressure, high flow rate pump such as a kinetic or positive displacement device (e.g. a centrifugal fan or piston-type device) with ducts that direct the air to the inlets 222 of the individual blades.

Referring more specifically to FIG. 16, the exemplary blade 202 includes respective pluralities of electronic components and aerodynamic devices that are associated with the circuit board 218. More specifically, the exemplary blade 202 includes a plurality of processors 102 with finned heat sinks 108 (or, alternatively, heat sinks 108c, 108d and 108g) that are mounted on the circuit board 218. The circuit board 218 is secured to the side wall 210 and an air passage 248 extends from the circuit board to the inner surface of side wall 208. Suitable aerodynamic devices include, for example, aerodynamic devices similar to those discussed above in the context of FIGS. 4-7D and, in the illustrated embodiment, aerodynamic devices 116 and 118 are located at the forward and rearward ends of the processors 102. A plurality of memory cards 226 are also carried by the circuit board 218 and aerodynamic devices 228 and 230 are located at the forward and rearward ends of the memory cards. A video card 232 is also carried by the circuit board 218, and aerodynamic devices 234 and 236 are located at the forward and rearward ends of the video card. The circuit board 218 also carries a pair of hard drives 238. Aerodynamic devices 240 and 242 are located at the forward and rearward ends of the hard drives 238. The exemplary blade 202 is also provided with a power supply 244, and an aerodynamic device 246 is located at the forward end of the power supply. The aerodynamic devices perform the function of maintaining laminar air flow in the air flow region 248 within the blade 202, i.e. the region within the housing 206 between the circuit board 218 and the inner surface of the side wall 208 (FIG. 14).

Figure 17:
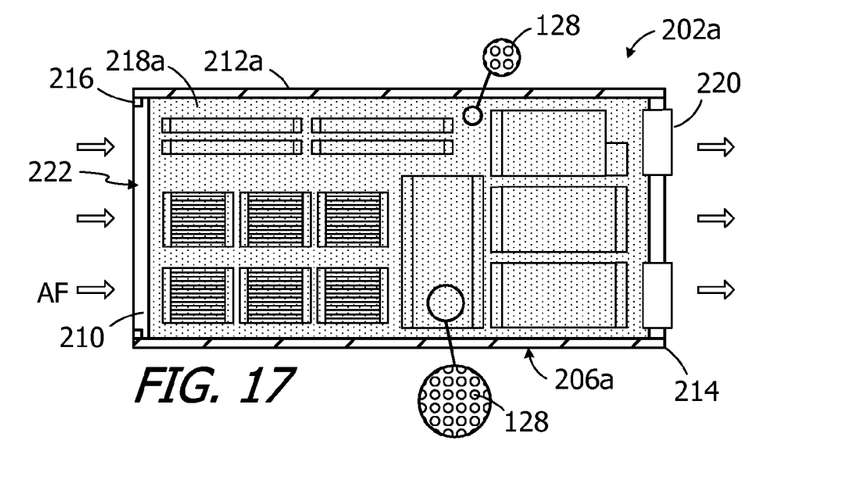
FIG. 17 is a section view showing the interior of a blade in accordance with one embodiment of a present invention.
Figure 18:
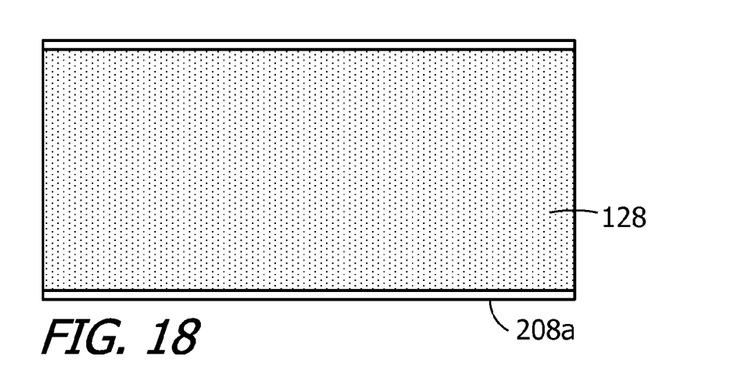
FIG. 18 is a plan view of the interior surface of a portion the blade illustrated in FIG. 17.

Another exemplary blade is generally represented by reference numeral 202a in FIGS. 17 and 18. Blade 202a includes the same electronic components and has the same overall housing configuration as blade 202. Here, however, the circuit board 218a, all of the electronic components, and all of the aerodynamic devices include surface discontinuities 128. As noted above in the context of FIGS. 12 and 13, such surface discontinuities create a thin layer of turbulent air flow that increases heat transfer and reduces drag. Surface discontinuities 128 may also be provided on the inner surfaces of the blade housing 206a that are not covered by the circuit board 218a, i.e. the inner surfaces of the side wall 208a, top wall 212a, and bottom wall 214a. Alternatively, in other implementations, surface discontinuities may be provided on a portion, but not all, of the circuit board, some but not all of the electronic components, some but not all of the aerodynamic elements, and portions, but not all, of the inner surfaces of the housing that are not covered by the circuit board.

Another method of increasing the cooling efficiency of a blade or other electronic apparatus involves redirecting or otherwise altering the air flow within the apparatus. Such air flow alteration may take a variety of forms such as, for example, diverting air that would otherwise flow over relatively cool portions of the electronic apparatus to relatively hot portions of the electronic apparatus as well as varying the cross-sectional area of air flow region within the apparatus.

Figure 19:
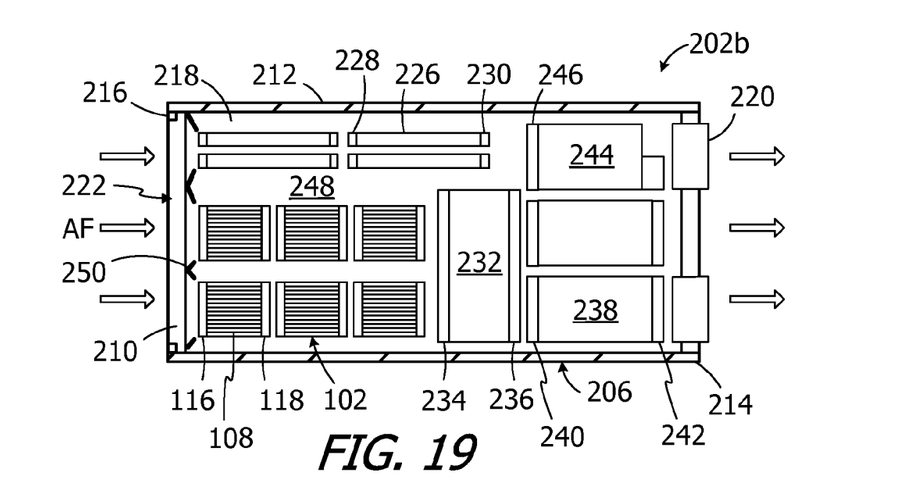
FIG. 19 is a section view showing the interior of a blade in accordance with one embodiment of a present invention.

One example of such an electronic apparatus is the blade 202b illustrated in FIG. 19. Blade 202b is essentially identical to blade 202 in that blade 202b includes the same arrangement of electronic components (e.g. processors 102) and aerodynamic devices (e.g. aerodynamic devices 116 and 118). In addition, blade 202b includes a plurality of air diverters 250 adjacent to the housing inlet 222. The exemplary air diverters 250 are located on the circuit board 218 and may extend from the circuit board to the inner surface of the housing side wall 208 (FIG. 14). Alternatively, the air diverters 250 may be an integral part of the circuit board and extend to the inner surface of the housing side wall 208, or may be located on the exposed portion of the housing side wall 210 and extend to the inner surface of the housing side wall 208, or may be an integral part of one of the housing side walls and extend to the other side wall.

The exemplary air diverters 250 illustrated in FIG. 19 divert the air flow AF as it enters the blade 202b. More specifically, in the exemplary implementation, the air diverters 250 divert air that would otherwise flow into empty portions of the air flow region 248, i.e. the portion of the air flow region between the housing top wall 212 and the top row of memory cards 226, the portion of the air flow region between the bottom row of memory cards and the top row of processors 102, the portion of the air flow region between the top and bottom rows of processors, and the portion of the air flow region between the bottom row of processors and the housing bottom wall 214. Such air diversion improves the cooling efficiency of the blade 202b, as compared to an otherwise identical blade without the air diverters 250, by focusing the air flowing through the blade housing 206 on the components that require cooling.

The exemplary air diverters 250 illustrated in FIG. 19 include, depending on location, one or two planar walls. In other implementations, however, the walls may be differently shaped as necessary in order to to minimize drag, maximize air flow velocity, and/or create other conditions that result in more efficient heat transfer. For example, the air diverter walls may have a convex curve shape, a concave curve shape, an s-like shape with an inflection point, or any other appropriately curved shape.

It should also be noted here that, in other implementations, the number of diverters 250 may increased or decreased, the size and shape of the diverters may be varied, and one or more additional diverters may be located downstream from the diverters illustrated in FIG. 19. The diverters 250 may also be incorporated into the exemplary blade 202a discussed above in the context of FIGS. 17 and 18 as well as the exemplary blades 202c-202f discussed below with reference to FIGS. 20-25.

Figure 20:
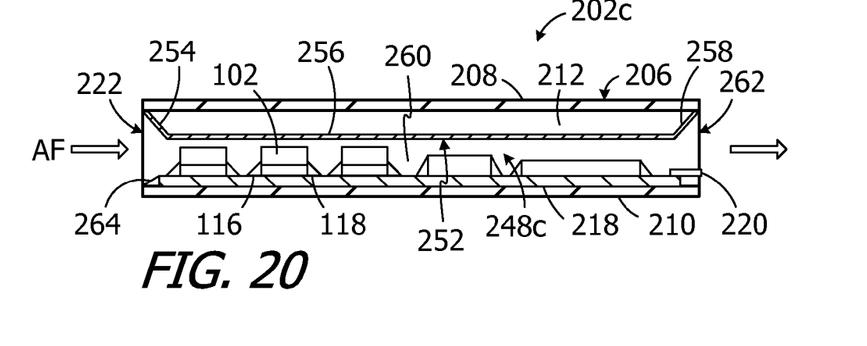
FIG. 20 is a section view showing the interior of a blade in accordance with one embodiment of a present invention.
Figure 20A:
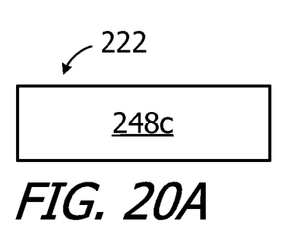
FIGS. 20A, 20B and 20C are representations of the cross-sectional area of the air flow region at various points within the blade illustrated in FIG. 20.
Figure 20B:
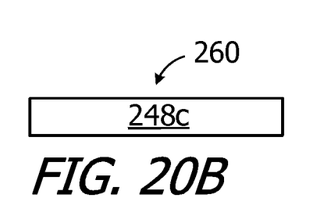
Figure 20C:
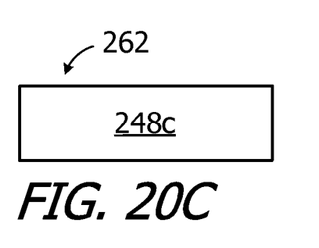

Another exemplary blade is generally represented by reference numerals 202c in FIG. 20. Blade 202c is essentially identical to blade 202 in that server blade 202c includes the same arrangement of electronic components (e.g. processors 102) and aerodynamic devices (e.g. aerodynamic devices 116 and 118). The blade 202c also includes a structure that performs the function of selectively decreasing and increasing the cross-sectional area of the air flow region 248c. More specifically, an internal wall 252 is located within the housing 206. The exemplary internal wall 252 extends from one end of the housing side wall 208 to the other, and from the housing top wall 212 to the housing bottom wall 214. The exemplary internal wall 252 also includes a first portion 254 that slopes from the side wall 208 toward the circuit board 218 and into the housing 206, a second portion 256 that is parallel to the circuit board, and a third portion 258 that slopes back toward the side wall 208. As a result of the internal wall 252, the cross-sectional area of the air flow region 248c, i.e. the cross-sectional area that is perpendicular to the direction of the air flow AF, is relatively large at the inlet 222, is relatively small within the portion 260 of the air flow region which is occupied by the electronic components, and is relatively large at the outlet 262, as is shown in FIGS. 20A-20C.

It should also be noted here that, instead of being constant, the distance between the second portion 256 of the internal wall 252 and the circuit board 218 may vary, as a function of the height of the electronic components, along the length of the second portion. For example, the distance between the internal wall 252 and the circuit board 218 may be less, in the vicinity of electronic components that are relatively short, than it is in the vicinity of electronic components that are relatively tall. The variation in distance may be accomplished by adding gradual bends to the internal wall second portion 256, both toward and away from the circuit board 218, where appropriate.

The reduction in cross-sectional area improves the efficiency of the cooling process in a number if ways. For example, the reduction in cross-sectional area focuses the air flow into the portion of the air flow region 248c where the electronic components are located and heat transfer is occurring. Additionally, the transition from a relatively large cross-sectional area at the inlet 222 to a smaller cross-sectional area increases the air speed and, therefore, heat transfer to the air in the region where the electronic components are located. The downstream increase in cross-sectional area at the outlet 262 may be employed to match the impedance of a fluid flowing from a confined space to an open space and/or to reduce the velocity and increase the distribution of the air re-entering the associated data center environment such that the air flow conforms to the data center requirements.

The exemplary blade 202c illustrated in FIG. 20 also includes an aerodynamic element 264 located upstream of the circuit board 218. The aerodynamic element 264 eliminates the abrupt discontinuity in the air flow direction associated with the leading edge of the circuit board 218. Similarly located aerodynamic elements 264 may also be included in the blades discussed above in the context of FIGS. 16-19 and the blades discussed below in the context of FIGS. 21-25.

The exemplary blade 202c may also be provided with surface discontinuities, such as the surface discontinuities 128 described above with reference to FIGS. 12 and 13. Such surface discontinuities create a thin layer of turbulent air flow that increases heat transfer and reduces drag by breaking up the boundary layer. The blade 202d illustrated in FIGS. 21 and 22, for example, is essentially identical to blade 202c but for the addition of surface discontinuities 128. More specifically, blade 202d includes the same electronic components and has the same overall housing configuration as blade 202c. The distance between the internal wall second portion 256d and the circuit board 218d may be constant as shown, or variable as is discussed above with reference to second portion 256.

Figure 21:
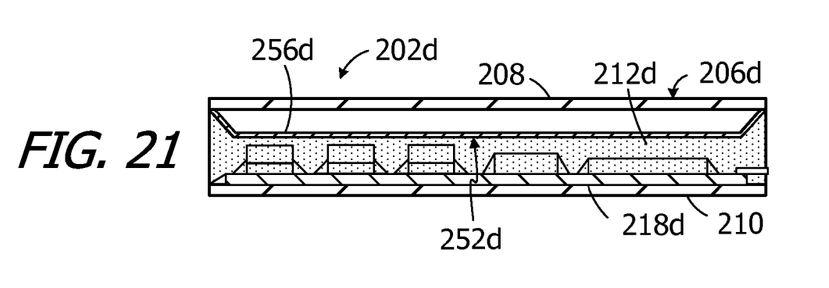
FIG. 21 is a section view showing the interior of a blade in accordance with one embodiment of a present invention.
Figure 22:
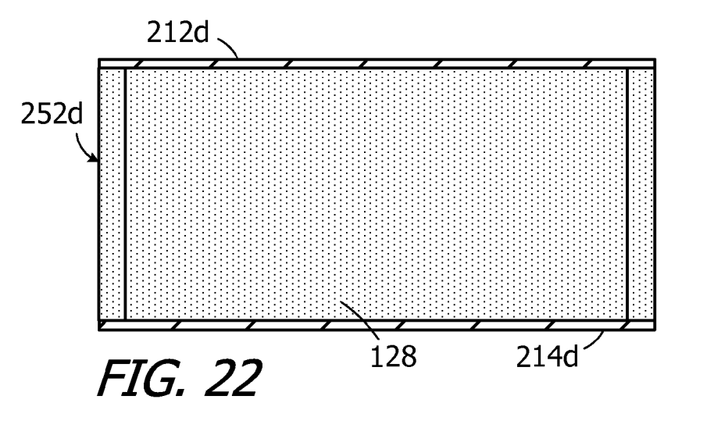
FIG. 22 is a plan view of the interior surface of a portion of a blade illustrated in FIG. 21.

Here, however, the circuit board 218d, all of the electronic components, all of the aerodynamic devices, and the interior surface of the internal wall 252d include surface discontinuities 128. Surface discontinuities 128 may also be provided on the inner surfaces of the blade housing 206d that are not covered by the circuit board 218d or the internal wall 252d, i.e. the inner surfaces of the top wall 212d and the bottom wall 214d. Alternatively, in other implementations, surface discontinuities may be provided on a portion, but not all, of the circuit board, some but not all of the electronic components, some but not all of the aerodynamic elements, and portions, but not all, of the inner surfaces of the housing that are not covered by the circuit board.

Figure 23:
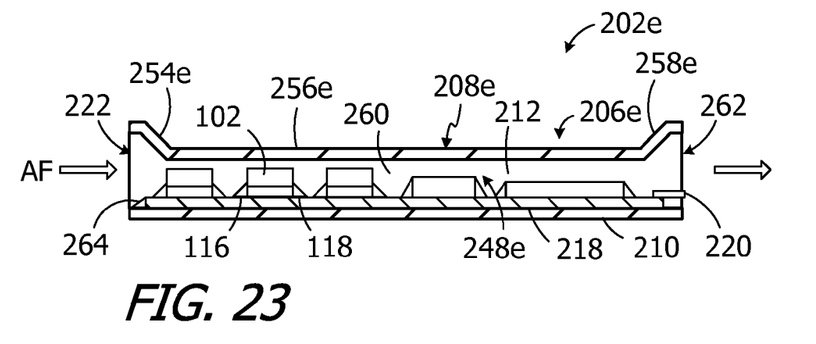
FIG. 23 is a section view showing the interior of a blade in accordance with one embodiment of a present invention.
Figures 23A, 23B, 23C:
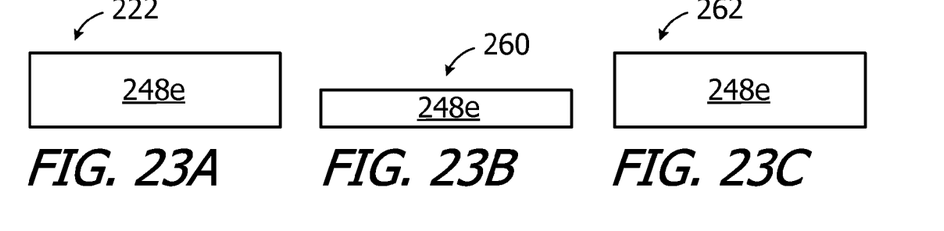
FIGS. 23A, 23B and 23C are representations of the cross-sectional area of the air flow region at various points within the blade illustrated in FIG. 23.
Figure 24:
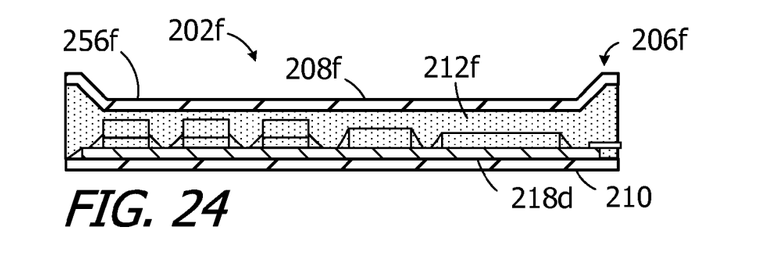
FIG. 24 is a section view showing the interior of a blade in accordance with one embodiment of a present invention.
Figure 25:
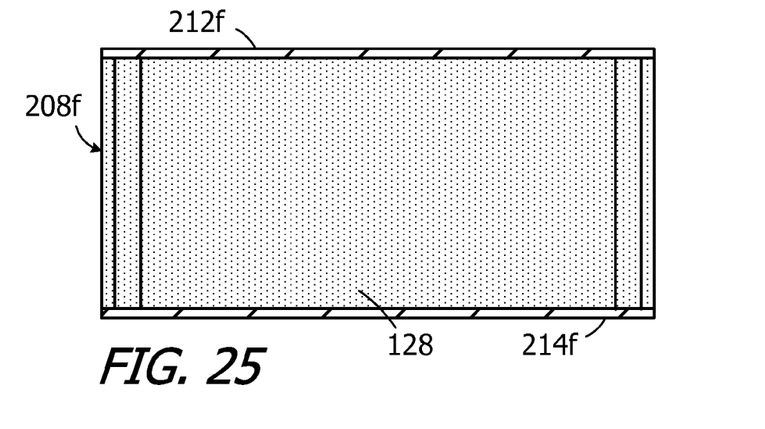
FIG. 25 is a plan view of the interior surface of a portion of a blade illustrated in FIG. 24.

The variations in air flow region cross-sectional area in a blade or other electronic apparatus may also be accomplished without the use of the above-described internal wall 252 or other additional structural elements. One example of such a blade is generally represented by reference numeral 202e in FIG. 23. Blade 202e is essentially identical to blade 202 in that blade 202e includes the same electronic components (e.g. processors 102) and aerodynamic devices (e.g. aerodynamic devices 116 and 118). The blade 202e also includes a structure that performs the function of selectively decreasing and increasing the cross-sectional area of the air flow region 248e. More specifically, the housing side wall 208e includes a first portion 254e that slopes toward the circuit board 218 and into the housing 206e, a second portion 256e that is parallel to the circuit board, and a third portion 258e that slopes away from the circuit board. Due to the shape of the housing side wall 208e, the cross-sectional area of the air flow region 248e, i.e. the cross-sectional area that is perpendicular to the direction of the air flow AF, is relatively large at the inlet 222, is relatively small within the portion 260 of the air flow region which is occupied by the electronic components, and is relatively large at the outlet 262, as is shown in FIGS. 23A-23C. As discussed in detail above, the decrease in cross-sectional area advantageously focuses the air flow into the region where the electronic components are located and increases air speed. It should also be noted that, in alternative embodiments, the distance between the side wall second portion 256e and the circuit board 218 may be variable, as is discussed above with reference to internal wall second portion 256.

The exemplary blade 202e may also be provided with surface discontinuities, such as the surface discontinuities 128 described above with reference to FIGS. 12 and 13. The blade 202f illustrated in FIGS. 24 and 25, for example, is essentially identical to blade 202e but for the addition of surface discontinuities 128. More specifically, blade 202f includes the same electronic components and has the same overall housing configuration as blade 202e. The distance between the side wall second portion 256f and the circuit board 218d may be constant as shown, or variable as is discussed above with reference to internal wall second portion 256. Here, however, the circuit board 218f, all of the electronic components, all of the aerodynamic devices, and the interior surface of the housing side wall 208f include surface discontinuities 128. Surface discontinuities 128 may also be provided on the inner surfaces of the blade housing 206d that are not covered by the circuit board 218f, i.e. the inner surfaces of the top wall 212f and the bottom wall 214f. Alternatively, in other implementations, surface discontinuities may be provided on a portion, but not all, of the circuit board, some but not all of the electronic components, some but not all of the aerodynamic elements, and portions, but not all, of the inner surfaces of the housing that are not covered by the circuit board.

Although the present inventions have been described in terms of the preferred embodiments above, numerous modifications and/or additions to the above-described preferred embodiments would be readily apparent to one skilled in the art. By way of example, but not limitation, the electronic apparatus in accordance with the present inventions may include multiple circuit boards and apparatus other than servers (e.g. entertainment systems and personal computers). It is intended that the scope of the present inventions extend to all such modifications and/or additions.

We claim:

1. An electronic system, comprising:
   a circuit board having a surface;
   an electronic component associated with the surface of the circuit board;
   a heat sink configured to accept heat generated by the electronic component and transfer the heat to an air flow;
   surface discontinuities disposed on said heat sink, the surface discontinuities being configured to generate a thin layer of turbulent air flow, the thin layer being between 0.5% to 5% of the total thickness of a contiguous laminar portion of the air flow; and
   at least one aerodynamic element associated with the electronic component and the surface of the circuit board.

2. An electronic system as claimed in claim 1, wherein the at least one aerodynamic element includes an s-like curved top surface, the at least one aerodynamic element comprising a first aerodynamic element and a second aerodynamic element, a first aerodynamic element being abutted to an upstream surface of the heat sink and a second aerodynamic element being abutted to a down stream surface of the heat sink.

3. An electronic system as claimed in claim 1, in which the surface discontinuities are disposed on at least two of: the circuit board, the electronic component, the heat sink, an interior surface of a housing, a diverter and the at least one aerodynamic element.

4. The system of claim 1, in which the heat sink comprises a plurality of fins, an integral upstream surface of the plurality of fins being contoured to reduce turbulent air flow within said heat sink.

5. The system of claim 4, in which the integral upstream surface of the plurality of fins has a convex curvature.

6. The system of claim 4, in which the integral upstream surface of the plurality of fins has a tapered cross-section.

7. The system of claim 4, in which both the integral upstream surface and integral downstream surface of the plurality of fins are contoured to reduce turbulent air flow.

8. The system of claim 1, in which the aerodynamic element further comprises a base and a plurality of tapered projections, the plurality of tapered projections extending up from the curved surface of the base to create grooves which direct the air flow upward and around the upstream ends of the plurality of fins.

9. The system of claim 1, in which the thin layer of turbulent air flow produced by the surface discontinuities is between 100 microns and 2000 microns thick.

10. The system of claim 1, in which the surface discontinuities comprise an array of dimple-like indentations.

11. The system of claim 10, in which the array of dimple-like indentations comprise indentations having a diameter between about 250 microns to about 1000 microns, a depth of about 50 microns to about 250 microns, and a pitch of about 1000 microns to about 2500 microns.

12. The system of claim 1, further comprising a physical expansion of an air channel within the heat sink, the physical expansion of the air channel causing an adiabatic expansion of the air flow entering the heat sink.

13. The system of claim 12, in which a top surface of an aerodynamic element on an upstream side of the heat sink is offset from a surface of the heat sink to create the adiabatic expansion of air flow.

14. The system of claim 13, in which the top surface of an aerodynamic element on an upstream side of the heat sink is vertically offset from an horizontal surface of the heat sink to create the adiabatic expansion of air flow.

15. An electronic system comprises: a housing; a circuit board disposed within the housing; an electronic component configured to be mounted on a surface of the circuit board; a heat sink with a plurality of fins, each of the plurality of fins having a contoured forward end and a contoured rearward end, the heat sink configured to be in thermal communication with the electronic component; a fan configured to generate an air flow through the housing, the air flow passing between the plurality of fins; a first aerodynamic element abutted to an upstream end of the heat sink, the aerodynamic element configured to direct a portion of the air flow upward into channels defined by the plurality of fins; a physical expansion of an air channel within the heat sink, the physical expansion of the air channel causing an adiabatic expansion of the air flow entering the heat sink; and in which heat generated by the electronic component is dissipated from the heat sink and into the air flow.

16. The system of claim 15, in which the housing defines an inlet, an interior, and an outlet, the electronic component being disposed in the interior, the cross-sectional area of the inlet and outlet being greater than the cross-sectional area of the interior.

17. The system of claim 15, further comprising a diverter configured to be positioned within at least one of the inlet and the interior; the diverter having at least one angled surface such that a portion of said air flow which impinges on said diverter is preferentially directed toward the heat sink and away from areas of the circuit board which produce less heat.

18. The system of claim 15, in which the aerodynamic element includes a compound s-like curved top surface.

19. The system of claim 15, further comprising a second aerodynamic element abutted to a downstream side of the heat sink.

20. The system of claim 15, in which the aerodynamic element further comprises a base and a plurality of tapered projections, the plurality of tapered projections extending up from the curved surface of the base to join with the plurality of fins and create grooves which direct the air flow upward and around the upstream ends of the plurality of fins.

21. The system of claim 15, in which a top surface of the aerodynamic element on an upstream side of the heat sink is offset from a surface of the heat sink to create the adiabatic expansion of air flow.

22. The system of claim 15, further comprising an array of dimple-like indentations which is disposed on at least one of: the circuit board, the electronic component, the heat sink, an interior surface of the housing, the diverters and the aerodynamic element, the array of dimple-like indentations comprises indentations having a diameter between about 250 microns to about 1000 microns, a depth of about 50 microns to about 250 microns, and a pitch of about 1000 microns to about 2500 microns.

* * * * *